United States Patent
Park et al.

(10) Patent No.: US 11,561,769 B2
(45) Date of Patent: Jan. 24, 2023

(54) RANDOM NUMBER GENERATOR INCLUDING A PLURALITY OF RING OSCILLATORS

(71) Applicant: SAMSUNG ELECTRONICS CO., LTD., Suwon-si (KR)

(72) Inventors: Ji-eun Park, Suwon-si (KR); Yong-ki Lee, Yongin-si (KR); Yun-hyeok Choi, Hwaseong-si (KR); Bohdan Karpinskyy, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 538 days.

(21) Appl. No.: 16/541,705

(22) Filed: Aug. 15, 2019

(65) Prior Publication Data
US 2020/0159497 A1 May 21, 2020

(30) Foreign Application Priority Data

Nov. 20, 2018 (KR) .................. 10-2018-0143913
Feb. 20, 2019 (KR) .................. 10-2019-0020054

(51) Int. Cl.
*G06F 7/58* (2006.01)
*H03K 3/017* (2006.01)
(Continued)

(52) U.S. Cl.
CPC ............... *G06F 7/588* (2013.01); *G06F 7/58* (2013.01); *G06F 7/582* (2013.01); *H03K 3/017* (2013.01); *H03K 3/0315* (2013.01); *H03K 19/21* (2013.01)

(58) Field of Classification Search
CPC ............ G06F 7/58–588; H03K 19/21; H03K 3/0315; H03K 3/017
See application file for complete search history.

(56) References Cited

U.S. PATENT DOCUMENTS 7,720,895 B2    5/2010   Luzzi et al.
8,443,022 B2 *  5/2013   Vasyltsov ............... H03K 3/84
                                                      708/250
(Continued)

FOREIGN PATENT DOCUMENTS

JP       2008-176698       7/2008

OTHER PUBLICATIONS

Y. Liu, R. C. C. Cheung and H. Wong, "A Bias-Bounded Digital True Random Number Generator Architecture," in IEEE Transactions on Circuits and Systems I: Regular Papers, vol. 64, No. 1, pp. 133-144, Jan. 2017, doi: 10.1109/TCSI.2016.2606353. (Year: 2017).*

*Primary Examiner* — Emily E Larocque
*Assistant Examiner* — Carlo Waje
(74) *Attorney, Agent, or Firm* — F. Chau & Associates, LLC

(57) ABSTRACT

A random number generator including: a first ring oscillator including a first inverter chain, the first inverter chain including a plurality of serially connected first inverters, the first ring oscillator configured to output a first random signal generated at a first sub-node between two neighboring first inverters among the plurality of first inverters; a second ring oscillator including a second inverter chain, the second inverter chain including a plurality of serially connected second inverters, the second ring oscillator configured to output a second random signal generated at a second sub-node between two neighboring second inverters among the plurality of second inverters; and a signal processing circuit for generating a random number by combining the first random signal with the second random signal.

18 Claims, 12 Drawing Sheets

(51) Int. Cl.
*H03K 19/21* (2006.01)
*H03K 3/03* (2006.01)

(56) References Cited

U.S. PATENT DOCUMENTS

| | | | | |
|---|---|---|---|---|
| 8,874,632 B2* | 10/2014 | Vasyltsov | ............... | G06F 7/588 |
| | | | | 708/255 |
| 9,058,228 B2 | 6/2015 | Sackett | | |
| 9,335,972 B2 | 5/2016 | Yang et al. | | |
| 9,361,066 B2* | 6/2016 | Rooks | ............... | G06F 7/588 |
| 9,377,997 B2* | 6/2016 | Vasyltsov | ............... | H03K 3/84 |
| 2003/0037079 A1* | 2/2003 | Wilber | ............... | G06F 7/588 |
| | | | | 708/250 |
| 2007/0043798 A1* | 2/2007 | Boerstler | ............... | H04L 9/001 |
| | | | | 708/251 |
| 2010/0153478 A1* | 6/2010 | Aliseychik | ............ | H04L 9/0662 |
| | | | | 708/255 |
| 2010/0201419 A1* | 8/2010 | Vasyltsov | ............... | G06F 7/588 |
| | | | | 327/164 |
| 2011/0131263 A1* | 6/2011 | Vasyltsov | ............... | G06F 7/588 |
| | | | | 708/251 |
| 2011/0169579 A1 | 7/2011 | Dodrill | | |
| 2011/0302232 A1* | 12/2011 | Vasyltsov | ............... | G06F 7/588 |
| | | | | 708/251 |
| 2014/0237011 A1* | 8/2014 | Sackett | ............... | G06F 7/582 |
| | | | | 708/250 |
| 2015/0154006 A1* | 6/2015 | Yang | ............... | H03K 3/84 |
| | | | | 708/251 |
| 2015/0193208 A1* | 7/2015 | Rooks | ............... | H03K 3/84 |
| | | | | 708/251 |
| 2016/0179472 A1* | 6/2016 | Sugahara | ............... | G06F 7/588 |
| | | | | 708/251 |
| 2017/0048061 A1* | 2/2017 | Bohdan | ............... | H04L 9/0662 |
| 2018/0196641 A1 | 7/2018 | Aoyagi | | |
| 2018/0241381 A1* | 8/2018 | Yi | ............... | H03K 5/159 |
| 2021/0365242 A1* | 11/2021 | Golofit | ............... | G06F 7/588 |

* cited by examiner

RANDOM NUMBER GENERATOR INCLUDING A PLURALITY OF RING OSCILLATORS

CROSS-REFERENCE TO RELATED APPLICATIONS

This application claims priority under 35 U.S.C. § 119 to Korean Patent Application No. 10-2018-0143913, filed on Nov. 20, 2018 and Korean Patent Application No. 10-2019-0020054, filed on Feb. 20, 2019 in the Korean Intellectual Property Office, the disclosures of which are incorporated by reference herein in their entireties.

TECHNICAL FIELD

The inventive concept relates to a random number generator, and more particularly, to a random number generator for generating random numbers based on random signals generated by a plurality of ring oscillators.

DISCUSSION OF RELATED ART

In general, a smart card uses an encrypted key in data communications to protect personal information of a user, An encrypted key is typically a random string of numbers generated specifically to scramble and unscramble data. The random numbers may be classified as pseudo random numbers or true random numbers.

The pseudo random numbers are artificially generated by using a logic circuit and software. The pseudo random numbers may be obtained by using a Rivest-Shamir-Adelman (RSA) algorithm and an elliptic curve cryptosystem.

The true random numbers are generated by using a physical phenomenon that exists in the natural world. The physical phenomenon may be, for example, thermal noise of a resistor, short noise of a PN junction of a semiconductor, short noise caused by generation of a photon, generated waves of radioactive rays, or meta-stability. The true random numbers may be referred to as physical random numbers due to their unpredictability.

A ring oscillator may vibrate by repeatedly inverting amplifying an output signal. A transition point in time of the signal output by the ring oscillator may randomly change in accordance with a Gaussian distribution. A Gaussian distribution region of the output signal may be referred to as jitter. The random number generator may generate the true random numbers based on the randomly changed jitter.

SUMMARY

According to an exemplary embodiment of the inventive concept, there is provided a random number generator including a first ring oscillator including a first inverter chain, the first inverter chain including a plurality of serially connected first inverters, the first ring oscillator configured to output a first random signal generated at a first sub-node between two neighboring first inverters among the plurality of first inverters; a second ring oscillator including a second inverter chain, the second inverter chain including a plurality of serially connected second inverters, the second ring oscillator configured to output a second random signal generated at a second sub-node between two neighboring second inverters among the plurality of second inverters; and a signal processing circuit for generating a random number by combining the first random signal with the second random signal.

According to an exemplary embodiment of the inventive concept, there is provided a random number generator including a first ring oscillator group including a plurality of first ring oscillators configured to output a plurality of first random signals generated at a plurality of first sub-nodes between two neighboring first inverters among a plurality of first inverters included in each of the plurality of first ring oscillators; a second ring oscillator group including a plurality of second ring oscillators configured to output a plurality of second random signals generated at a plurality of second sub-nodes between two neighboring second inverters among a plurality of second inverters included in each of the plurality of second ring oscillators; a third ring oscillator group including a plurality of third ring oscillators configured to output a plurality of third random signals generated at a plurality of third sub-nodes between two neighboring third inverters among a plurality of third inverters included in each of the plurality of third ring oscillators; and a signal processing circuit for generating a random number based on a combination of the plurality of first random signals, the plurality of second random signals, and the plurality of third random signals.

According to an exemplary embodiment of the inventive concept, there is provided a random number generator including a first inverter chain including a plurality of serially connected first inverters; a second inverter chain including a plurality of serially connected second inverters; and a logic element connected to a first sub-node between two adjacent first inverters of the plurality of first inverters and a second sub-node between two adjacent second inverters of the plurality of second inverters, the logic element configured to generate a combining signal by combining a first random signal of the first sub-node and a second random signal of the second sub-node, wherein a random number is generated by sampling the combining signal.

According to an exemplary embodiment of the inventive concept, there is provided a random number generator including: a plurality of serially connected first inverters configured to output a first random signal; a plurality of serially connected second inverters configured to output a second random signal; and a signal processing circuit for generating a random number by using the first random signal and the second random signal.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
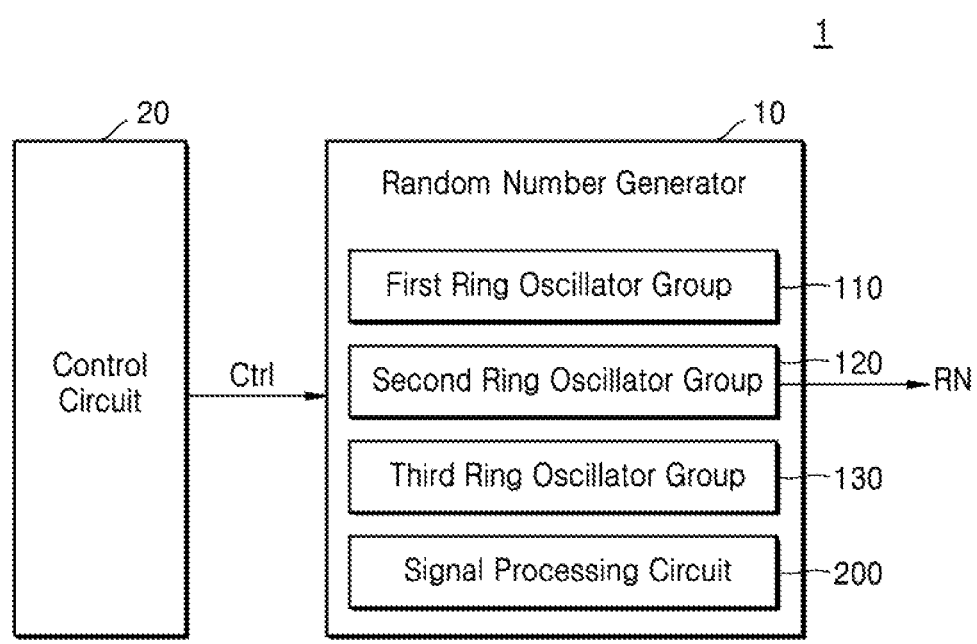
FIG. 1 is a block diagram illustrating an electronic system according to an exemplary embodiment of the inventive concept.

FIG. 1 is a block diagram illustrating an electronic system 1 according to an exemplary embodiment of the inventive concept.

Referring to FIG. 1, the electronic system 1 may include a random number generator 10 and a control circuit 20. The electronic system 1 may be a device for performing various operations by using random numbers and may be, for example, a laptop computer, a mobile telephone, a smart phone, a tablet personal computer (PC), a personal digital assistant (PDA), a smart card, or a semiconductor package.

The control circuit 20 may output a varying control signal Ctrl for controlling the random number generator 10. The control signal Ctrl may be a mode determining signal for determining a mode for a plurality of ring oscillators included in first, second and third ring oscillator groups 110, 120 and 130, an enable signal for enabling the first to ninth ring oscillators, or a sampling control signal SS for changing a random signal in an analog region into a random number RN in a digital region. The control signal Ctrl will be described in detail with reference to FIG. 2.

The random number generator 10 may generate the random number RN in the digital region, which is randomly configured by 0 or 1, based on the control signal Ctrl. To accomplish this, the random number generator 10 may include the first ring oscillator group 110, the second ring oscillator group 120, the third ring oscillator group 130, and a signal processing circuit 200.

The first ring oscillator group 110 may include a plurality of ring oscillators. Each of the plurality of ring oscillators may include a plurality of inverters. The random signal that vibrates by repeatedly inverting amplifying the plurality of inverters may be generated by sub-nodes included in each of the plurality of ring oscillators. The second ring oscillator group 120 and the third ring oscillator group 130 may respectively generate a plurality of random signals by a method similar to that of the first ring oscillator group 110. Transition points in time of the plurality of random signals generated by the first ring oscillator group 110 to the third ring oscillator group 130 may be randomly changed in a jitter area. In the jitter area, randomness of the random signal may be secured.

The signal processing circuit 200 may generate a combining signal by combining the plurality of random signals generated by the first ring oscillator group 110 to the third ring oscillator group 130. The jitter area of each of the plurality of random signals generated by the first ring oscillator group 110 to the third ring oscillator group 130 may not cover an entire period.

The random number generator 10 according to an exemplary embodiment of the inventive concept may generate the combining signal, which has a jitter area that covers the entire period, by combining the plurality of random signals generated by the first ring oscillator group 110 to the third ring oscillator group 130 and may generate the random number RN by sampling the combining signal. Since the random number RN is generated by sampling the combining signal, which has a jitter area that covers the entire period, the randomness of the random number RN increases and the random number RN may be quickly generated by not performing sampling many times.

In FIG. 1, it is illustrated that the first to third ring oscillator groups 110 to 130 are included in the random number generator 10. However, this is just an example and more or less than three ring oscillator groups may be included in the random number generator 10.

Figure 2:
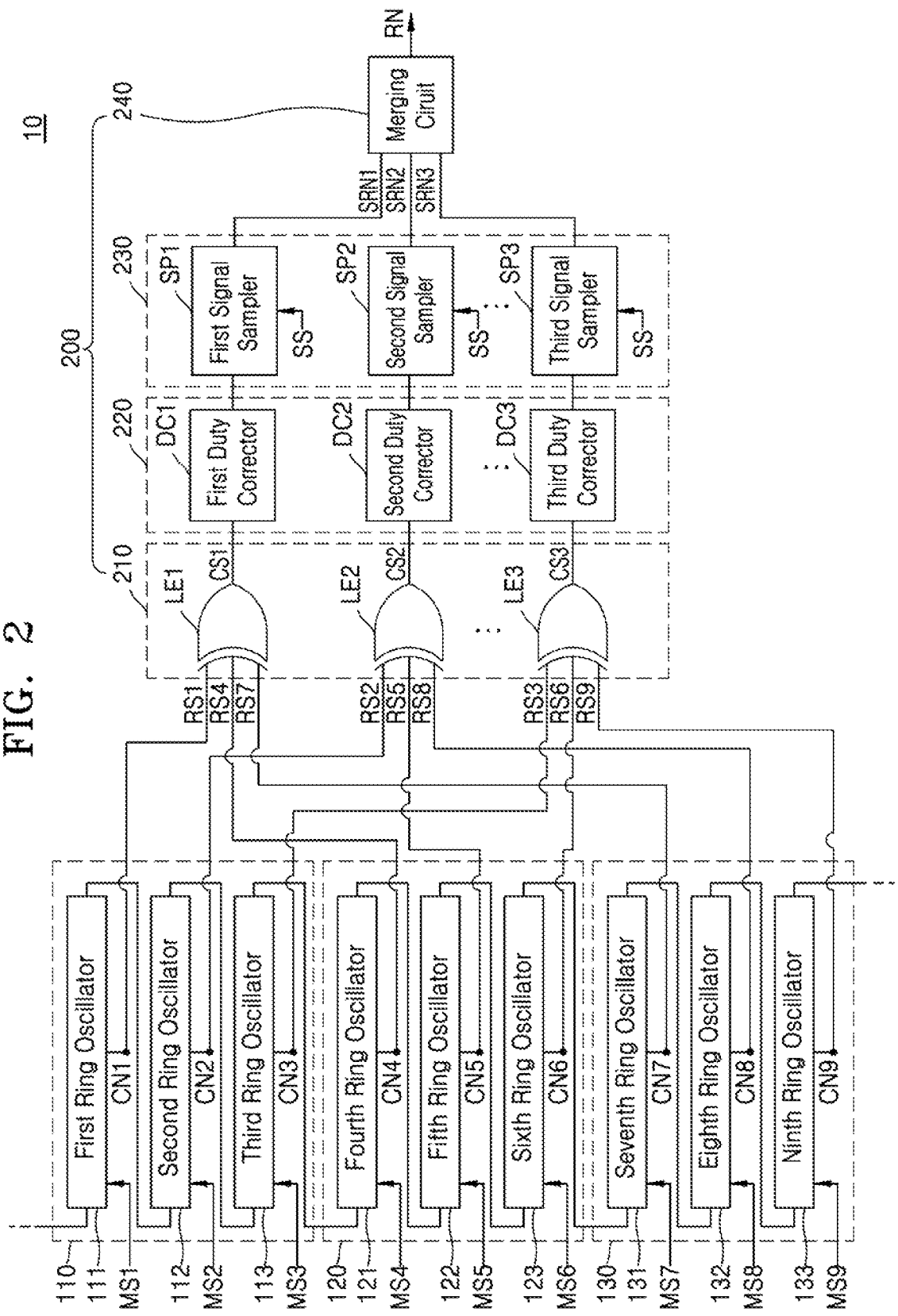
FIG. 2 is a block diagram illustrating a random number generator according to an exemplary embodiment of the inventive concept.

FIG. 2 is a block diagram illustrating a random number generator according to an exemplary embodiment of the inventive concept.

Referring to FIG. 2, the random number generator 10 may include the first ring oscillator group 110, the second ring oscillator group 120, the third ring oscillator group 130, and the signal processing circuit 200. The first ring oscillator group 110 may include a first ring oscillator 111, a second ring oscillator 112, and a third ring oscillator 113. In addition, the second ring oscillator group 120 may include a fourth ring oscillator 121, a fifth ring oscillator 122, and a sixth ring oscillator 123. The third ring oscillator group 130 may include a seventh ring oscillator 131, an eighth ring oscillator 132, and a ninth ring oscillator 133. In addition, the signal processing circuit 200 may include a logic circuit 210, a duty correcting circuit 220, a sampling circuit 230, and a merging circuit 240.

Each of the first ring oscillator 111 to the ninth ring oscillator 133 may include a plurality of inverters. A plurality of sub-nodes may be provided between neighboring inverters among the plurality of inverters. At least one connection node CN1 to CN9 among the plurality of sub-nodes may be connected to the logic circuit 210. In FIG. 2, each of the first ring oscillator 111 to the ninth ring oscillator 133 is illustrated as being connected to the logic circuit 210 through each of first, second, third, fourth, fifth, sixth, seventh, eighth and ninth connection nodes CN1, CN2, CN3, CN4, CN5, CN6, CN7, CN8 and CN9. However, the first ring oscillator 111 to the ninth ring oscillator 133 may be connected to the logic circuit 210 through one or more connection nodes among the plurality of sub-nodes, which will be described in detail with reference to FIGS. 3A to 4.

Each of the first ring oscillator 111 to the ninth ring oscillator 133 may determine a mode of each of the first to ninth ring oscillators 111 to 133 to be a meta-stability mode or an oscillation mode based on each of mode selection signals MS1, MS2, MS3, MS4, MS5, MS6, MS7, MS8 and MS9. The mode selection signals MS1 to MS9 may be received from the control circuit 20 (FIG. 1), and the first to ninth ring oscillators 111 to 133 are controlled by the different mode selection signals MS1 to MS9 or by a common mode selection signal. Modes of the first to ninth ring oscillators 111 to 133 will be described in detail with reference to FIGS. 6A and 6B.

The first ring oscillator 111 to the ninth ring oscillator 133 may output first, second, third, fourth, fifth, sixth, seventh, eighth and ninth random signals RS1, RS2, RS3, RS4, RS5, RS6, RS7, RS8 and RS9 having irregular periods to the logic circuit 210 through the first to ninth connection nodes CN1 to CN9. The logic circuit 210 may include first, second and third logic elements LE1, LE2 and LE3, and the first to third logic elements LE1 to LE3 may be connected to the first to ninth ring oscillators 111 to 133. In an exemplary embodiment of the inventive concept, each of the first to third logic elements LE1 to LE3 receives one random signal from each of the first to third ring oscillator groups 110 to 130 and may perform a logic operation on the received random signal. For example, each of the first to third logic elements LE1 to LE3 may be an XOR gate, and the first to third logic elements LE1 to LE3 may perform an XOR operation on the first to ninth random signals RS1 to RS9.

For example, the first logic element LE1 is connected to the first ring oscillator 111 through the first connection node CN1, the fourth ring oscillator 121 through the fourth connection node CN4, and the seventh ring oscillator 131 through the seventh connection node CN7. In addition, the first logic element LE1 receives the first random signal RS1 from the first ring oscillator 111 receives the fourth random signal RS4 from the fourth ring oscillator 121, receives the seventh random signal RS7 from the seventh ring oscillator 131. The first logic element LE1 may generate a first combining signal CS1 by performing an XOR operation on the received first, fourth, and seventh random signals RS1, RS4, and RS7.

In addition, the second logic element LE2 receives the second random signal RS2 from the second ring oscillator 112, receives the fifth random signal RS5 from the fifth ring oscillator 122, and receives the eighth random signal RS5 from the eighth ring oscillator 132. The second logic element LE2 may generate a second combining signal CS2 by performing an OR operation on the received second, fifth, and eighth random signals RS2, RS5, and RS8. In addition, the third logic element LE3 receives the third random signal RS3 from the third ring oscillator 113, receives the sixth random signal RS6 from the sixth ring oscillator 123, and receives the ninth random signal RS9 from the ninth ring oscillator 133. The third logic element LE3 may generate a third combining sinal CS3 by performing an XOR operation on the received third, sixth, and ninth random signals RS3, RS6, and RS9.

In an exemplary embodiment of the inventive concept, the first to third logic elements LE1 to LE3 may receive the first to ninth random signals RS1 to RS9 from the sub-nodes at uniform intervals (for example, a random signal may be received from a sub-node located after a uniform number of inverters).

According to an exemplary embodiment of the inventive concept, the first to ninth random signals RS1 to RS9 received by each of the first to third logic elements LE1 to LE3 may have different phases. Therefore, the first to ninth random signals RS1 to RS9 may have different transition points in time. In other words, since the jitter areas of the first to ninth random signals RS1 to RS9 are different from each other, jitter areas of the first to third combining signals CS1 to CS3 obtained by combining the first to ninth random signals RS1 to RS9 may cover a large region of a period, which will be described in detail with reference to FIG. 8.

The duty correcting circuit 220 may include first, second and third duty correctors DC1, DC2 and DC3. The first to third duty correctors DC1 to DC3 respectively receive the first to third combining signals CS1 to CS3 from the logic circuit 210 and may control duty ratios (for example, ratios between logic highs and logic lows of the first to third combining signals CS1 to CS3) of the first to third combining signals CS1 to CS3. For example, the first duty corrector DC1 connected to the first logic element LE1 receives the first combining signal CS1 from the first logic element LE1 and may control the duty ratio of the first combining signal CS1 to be 50%. In other words, the first duty corrector DC1 may control the first combining signal CS1 so that the ratio between the logic high and the logic low of the first combining signal CS1 is 1:1.

In addition, the second duty corrector DC2 receives the second combining signal CS2 from the second logic element LE2 and may control the duty ratio of the second combining signal CS2 and the third duty corrector DC3 receives the third combining signal CS3 from the third logic element LE3 and may control the duty ratio of the third combining signal CS3.

The sampling circuit 230 may include first, second and third signal samplers SP1, SP2 and SP3. The first to third signal samplers SP1 to SP3 may respectively generate sub-random numbers SRN1, SRN2 and SRN in the digital region by sampling the first to third combining signals CS1 to CS3 in the analog region with the duty ratios controlled by the duty correcting circuit 220 based on the sampling control signal SS. For example, the first signal sampler SP1 may generate the first sub-random number SRN1 by sampling the first combining signal CS1 in response to the sampling control signal SS, the second signal sampler SP2 may generate the second sub-random number SRN2 by sampling the second combining signal CS2 in response to the sampling control signal SS, and the third sampler SP3 may generate the third sub-random number SRN3 by sampling the third combining signal CS3 in response to the sampling control signal SS. For example, the sampling circuit 230 may receive the sampling control signal SS from the control circuit 20 (FIG. 1). The merging circuit 240 may generate the random number RN by receiving and merging the first to third sub-random numbers SRN1 to SRN3.

In FIG. 2, it is illustrated that three of the first to ninth ring oscillators 111 to 133 are included in each of the first to third ring oscillator groups 110 to 130. However, more or less than three ring oscillators may be included in the one of the first to third ring oscillator groups 110 to 130. In addition, in FIG. 2, it is illustrated that the first to third ring oscillator groups 110 to 130 are included in the random number generator 10. However, more or less than three ring oscillator groups may be included in the random number generator 10. For example, when four ring oscillator groups are included in the random number generator 10, four logic elements may be included in the random number generator 10. Furthermore, the number of random signals combined by one logic element may vary. For example, one logic element may combine more or less than three random signals.

In addition, in FIG. 2, it is illustrated that each of the first to ninth ring oscillators 111 to 133 is connected to the logic circuit 210 through the first to ninth connection nodes CN1 to CN9, respectively. However, each of the first to ninth ring oscillators 111 to 133 may be connected to the logic circuit 210 through different connection configurations.

Figure 3A:
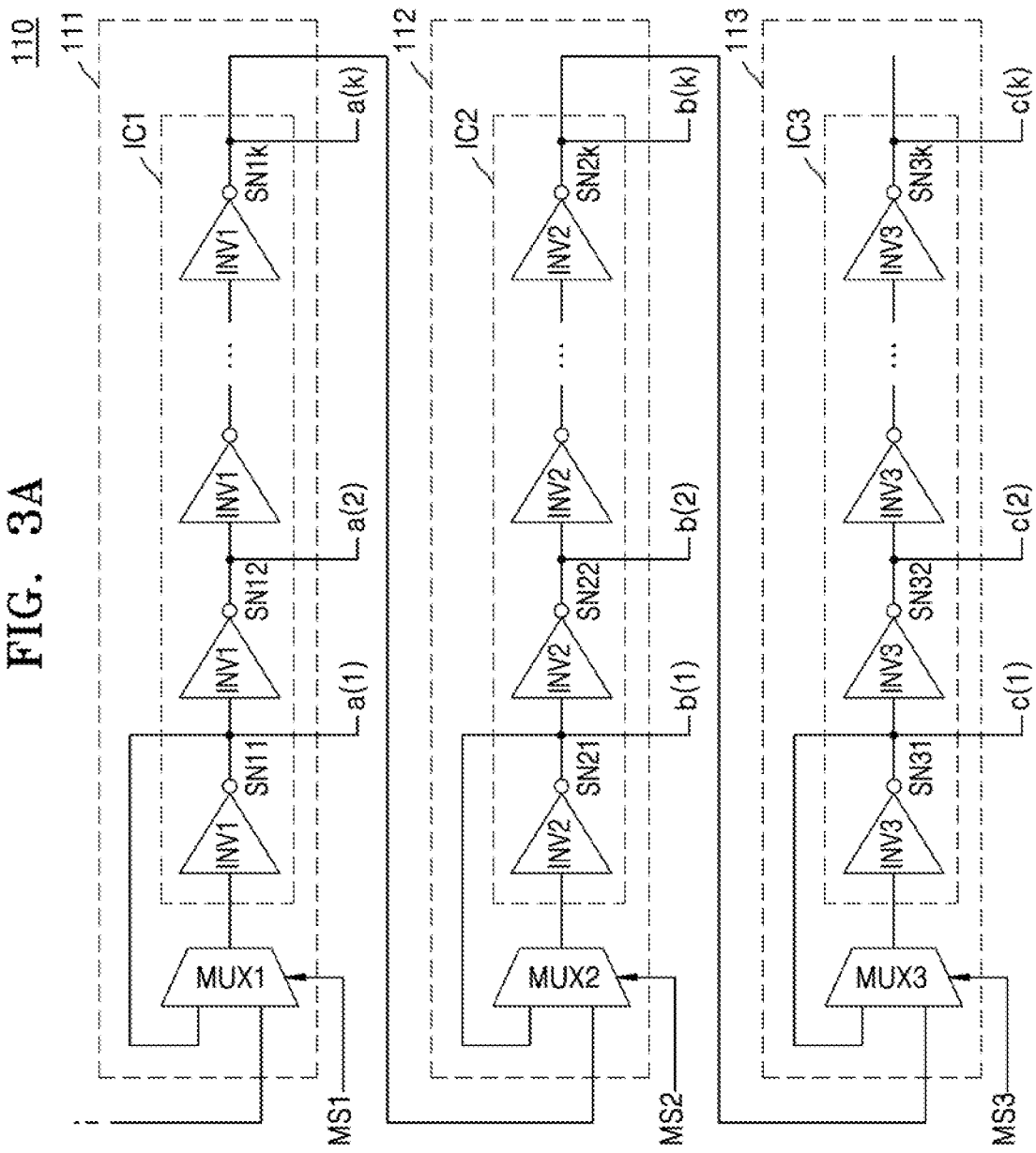
FIGS. 3A, 3B and 3C are circuit diagrams illustrating a ring oscillator group according to an exemplary embodiment of the inventive concept.
Figure 3B:
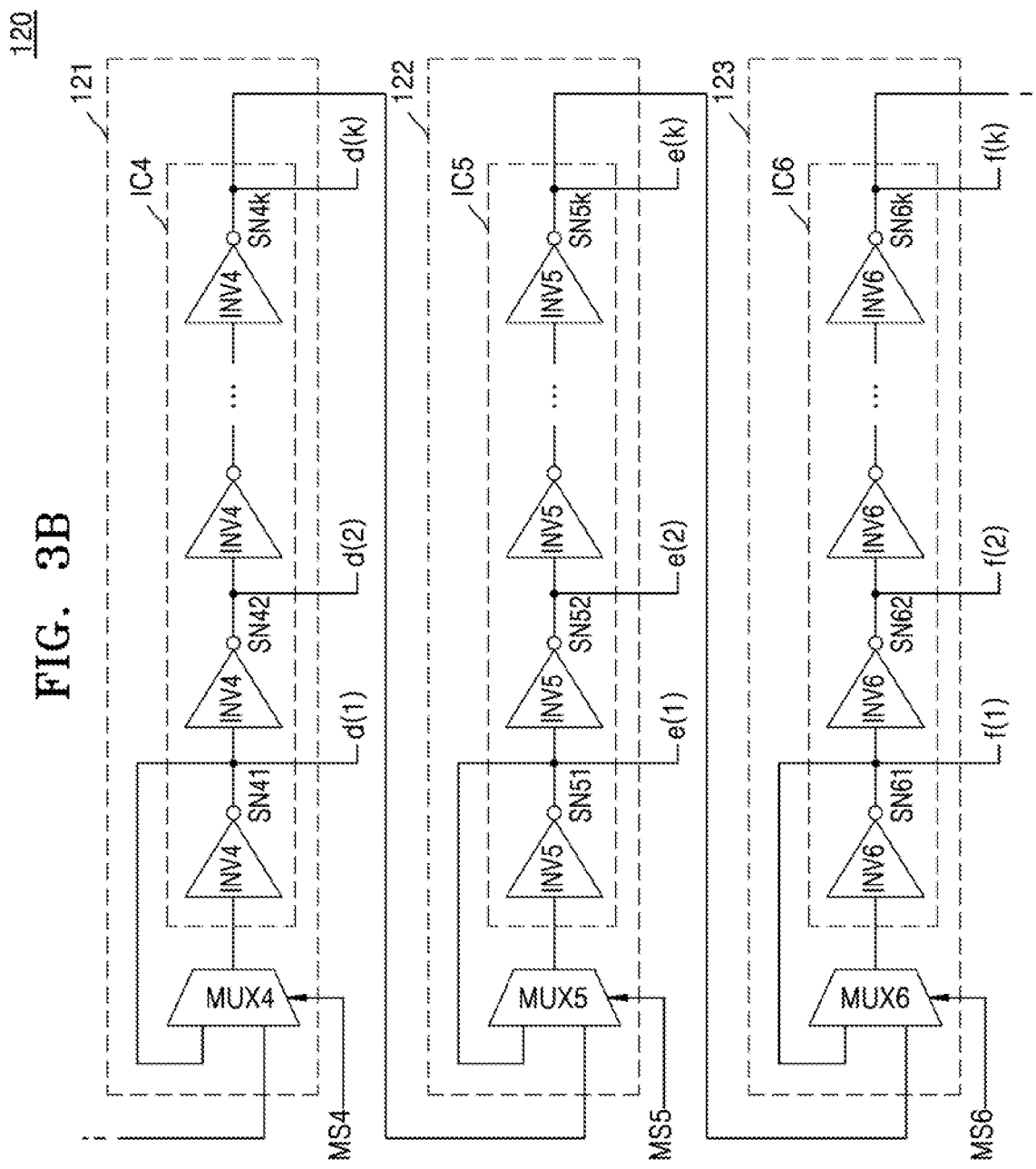
Figure 3C:
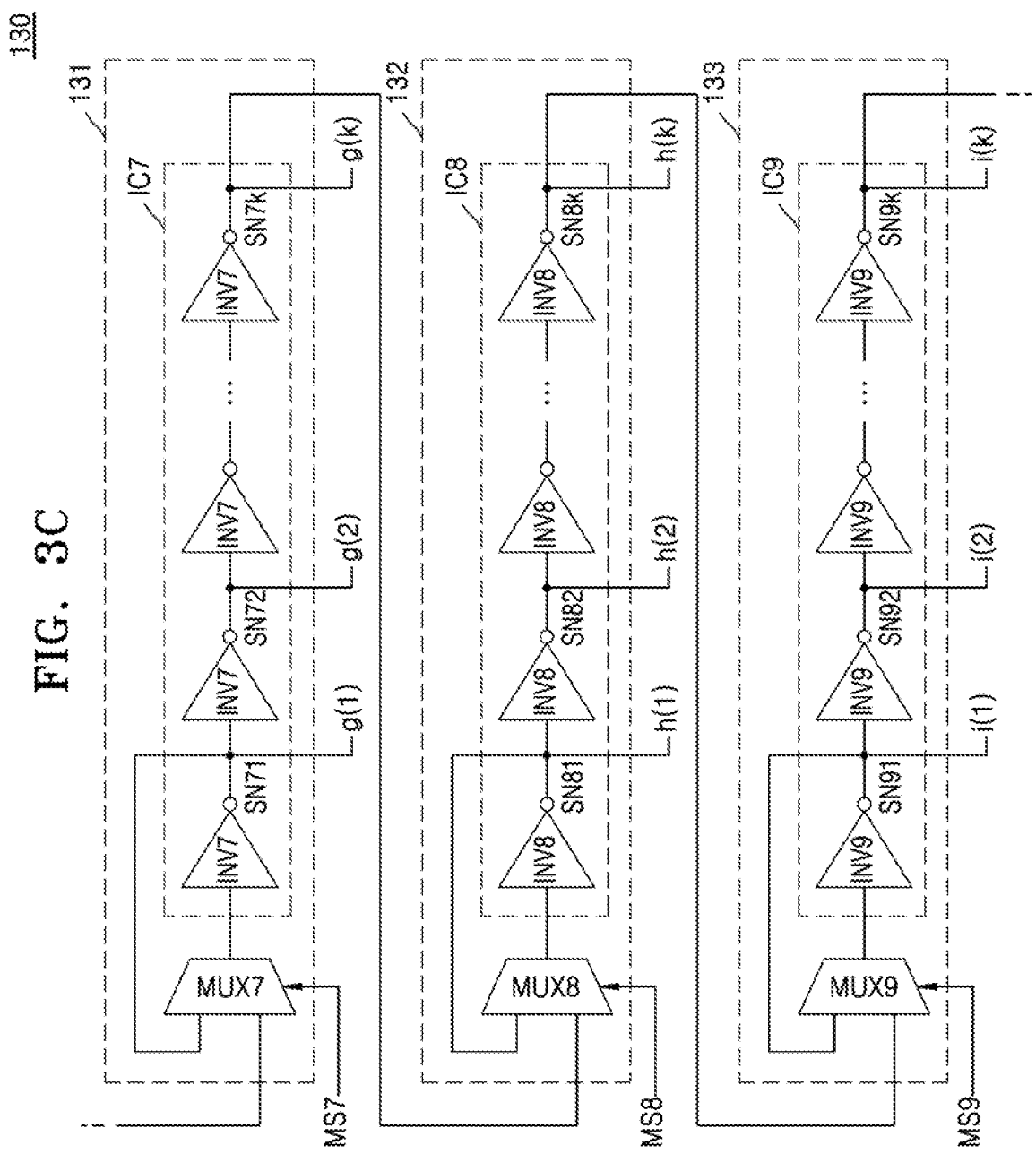

FIGS. 3A to 3C are circuit diagrams illustrating a ring oscillator group according to an exemplary embodiment of the inventive concept. For example, FIG. 3A illustrates the first ring oscillator group 110 of FIG. 2, FIG. 3B illustrates the second ring oscillator group 120 of FIG. 2, and FIG. 3C illustrates the third ring oscillator group 130 of FIG. 2.

Referring to FIGS. 2 and 3A, the first ring oscillator group 110 includes the first ring oscillator 111 to the third ring oscillator 113 and the first ring oscillator 111 may include a first multiplexer MUX1 and a first inverter chain IC1. The first inverter chain IC1 may include a plurality of first inverters INV1. The first inverter chain IC1 may include first sub-nodes SN11 to SN1$k$, wherein each of the first sub-nodes except for the first sub-node SN1k is positioned between neighboring first inverters INV1. For example, the first sub-node SN11 is positioned between adjacent first inverters INV1, The first sub-nodes SN11 to SN1k may be respectively connected to different logic elements. Each of the first sub-nodes SN11 to SN1k may be connected to a logic element (for example, a first logic element LE1, a fourth logic element LE4, or a seventh logic element LE7 of FIG. 4) through each of first to kth a lines a(1) to a(k), which will be described later with reference to FIG. 4.

In the first multiplexer MUX1, a first input end is connected to the first sub-node SN11, a second input end is connected to another ring oscillator, and an output end may be connected to an input end of the first inverter chain IC1. The first multiplexer MUX1 may set the first ring oscillator 111 to be in the meta-stability mode or the oscillation mode by connecting the input end of the first inverter chain IC1 to another ring oscillator or the first sub-node SN11 in response to the first mode selection signal MS1, which will be described later with reference to FIGS. 7A and 7B.

The second ring oscillator 112 includes a second multiplexer MUX2 and a second inverter chain IC2, and the second inverter chain IC2 may include a plurality of second inverters INV2. The second inverter chain IC2 may include second sub-nodes SN21 to SN2k, wherein each of the second sub-nodes except for the second sub-node SN2k is positioned between neighboring second inverters INV2. Each of the second sub-nodes SN21 to SN2k may be connected to a logic element (for example, a second logic element LE2, a fifth logic element LE5, or an eighth logic element LE8 of FIG. 4) through each of first to kth n lines b(1) to b(k).

The third ring oscillator 113 includes a third multiplexer MUX3 and a third inverter chain IC3, and the third inverter chain IC3 may include a plurality of third inverters INV3. The third inverter chain IC3 may include third sub nodes SN31 to SN3k, wherein each of the third sub-nodes except for the third sub-node SN3k is positioned between neighboring third inverters INV3. Each of the third sub-nodes SN31 to SN3k may be connected to a logic element (for example a third logic element LE3, a sixth logic element LE6, or a ninth logic element LE9 of FIG. 4) through each of first to kth c lines c(1) to c(k). Operations of the second ring oscillator 112 and the third ring oscillator 113 may be the same as or similar to the operation of the first ring oscillator 111, For example, the second multiplexer MUX2 may, set the second ring oscillator 112 to be in the meta-stability mode or the oscillation mode in response to the second mode selection signal MS2. The third multiplexer MUX3 may set the mode of the third ring oscillator 113 in response to the third mode selection signal MS3.

In an exemplary embodiment of the inventive concept, the number of inverters included in each of the first ring oscillator 111 to the third ring oscillator 113 may be the same.

Referring to FIG. 3B, the second ring oscillator group 120 may include the fourth ring oscillator 121 to the sixth oscillator 123. The fourth ring oscillator 121 includes a fourth multiplexer MUX4 and a fourth inverter chain IC4, and the fourth inverter chain IC4 may include a plurality of fourth inverters INV4, The fourth inverter chain IC4 may include fourth sub-nodes SN41 to SN4k, wherein each of the fourth sub-nodes except for the fourth sub-node SN4k is positioned between neighboring fourth inverters INV4. Each of the fourth sub-nodes SN41 to SN4k may be connected to a logic element (for example, the second logic element LE2, the fifth logic element LE5, or the eighth logic element LE8 of FIG. 4) through each of first to kth d lines d(1) to d(k).

The fifth ring oscillator 122 includes a fifth multiplexer MUX5 and a fifth inverter chain IC5, and the fifth inverter chain IC5 may include a plurality of fifth inverters INV5. The fifth inverter chain IC5 may include fifth sub-nodes SN51 to SN5k, wherein each of the fifth sub-nodes except for the fifth sub-node SN5k is positioned between neighboring fifth inverters INV5. Each of the fifth sub-nodes SN51 to SN5k may, be connected to a logic element (for example, the second logic element LE2, the fifth logic element LE5, or the eighth logic element LE8 of FIG. 4) through each of first to kth e lines e(1) to e(k).

The sixth ring oscillator 23 includes a sixth multiplexer MUX6 and a sixth inverter chain 106; and the sixth inverter chain 106 may include a plurality of sixth inverters INV6, The sixth inverter chain 106 may include sixth sub-nodes SN61 to SN6k, wherein each of the sixth sub-nodes except for the sixth sub-node SN6k is positioned between neighboring sixth inverters INV6. Each of the sixth sub-nodes SN61 to SN6k may be connected to a logic element (for example, the third logic element LE3, the sixth logic element LE6, or the ninth logic element LE9 of FIG. 4) through each of first to kth f lines f(1) to f(k).

An operation of the second ring oscillator group 120 may be the same as or similar to the operation of the first ring oscillator group 110. For example, the fourth multiplexer MUX4 may set the mode of the fourth ring oscillator 121 in response to the fourth mode selection signal MS4, the fifth multiplexer MUX5 may set the mode of the fifth ring oscillator 122 in response to the fifth mode selection signal MS5, and the sixth multiplexer MUX6 may set the mode of the sixth ring oscillator 123 in response to the sixth mode selection signal MS6.

Referring to FIG. 3C, the third ring oscillator group 130 may include the seventh ring oscillator 131 to the ninth ring oscillator 133. The seventh ring oscillator 131 includes a seventh multiplexer MUX7 and a seventh inverter chain IC7, and the seventh inverter chain IC7 may include a plurality of seventh inverters INV7. The seventh inverter chain IC7 may include seventh sub-nodes SN71 to SN7k, wherein each of the seventh sub-nodes except for the seventh sub-node SN7k is positioned between neighboring seventh inverters INV7, Each of the seventh sub-nodes SN71 to SN7k may be connected to a logic element (for example, the second logic element LE2, the fifth logic element LE5, or the eighth logic element LE8 of FIG. 4) through each of first to kth g lines g(1) to g(k).

The eighth ring oscillator 132 includes an eighth multiplexer MUX8 and an eighth inverter chain IC8, and the eighth inverter chain IC8 may include a plurality of eighth inverters INV8. The eighth inverter chain IC8 may include eighth sub-nodes SN81 to SN8k, wherein each of the eighth sub-nodes except for the eighth sub-node SN8k is positioned between neighboring eighth inverters INV8. Each of the eighth sub-nodes SN81 to SN8k may be connected to a logic element (for example, the second logic element LE2, the fifth logic element LE5, or the eighth logic element LE8 of FIG. 4) through each of first to loth h lines h(1) to h(k).

The ninth ring oscillator 133 includes a ninth multiplexer MUX9 and a ninth inverter chain IC9, and the ninth inverter chain IC9 may include a plurality of ninth inverters INV9. The ninth inverter chain IC9 may include ninth sub-nodes SN91 to SN9k, wherein each of the ninth sub-nodes except for the ninth sub-node SN9k is positioned between neighboring ninth inverters INV9. Each of the ninth sub-nodes SN91 to SN9k may be connected to a logic element (for example, the third logic element LE3, the sixth logic element LE6, or the ninth logic element LE9 of FIG. 4) through each of first to kth i lines i(1) to i(k).

An operation of the third ring oscillator group 130 may be the same as or similar to the operation of the first ring oscillator group 110. For example, the seventh multiplexer MUX7 may set the mode of the seventh ring oscillator 131 in response to the seventh mode selection signal MS7, the eighth multiplexer MUX8 may set the mode of the eighth ring oscillator 132 in response to the eighth mode selection signal MS8, and the ninth multiplexer MUX9 may set the mode of the ninth ring oscillator 133 in response to the ninth mode selection signal MS9.

In an exemplary embodiment of the inventive concept, the number of inverters included in each of the first to ninth ring oscillators connected to the same logic element may be the same. For example, the number of inverters INV1 included in the first ring oscillator 111 (FIG. 3A) connected to the first logic element LE1 of FIG. 4, the number of inverters INV4 included in the fourth ring oscillator 121 (FIG. 3B) connected to the first logic element LE1 of FIG. 4, and the number of inverters INV7 included in the seventh ring oscillator 131 (FIG. 3C) connected to the first logic element LE1 of FIG. 4 may equal to each other. Therefore, the uniform number of sub-nodes may be connected to one logic element (for example, the first logic element LE1 of FIG. 4).

Figure 4:
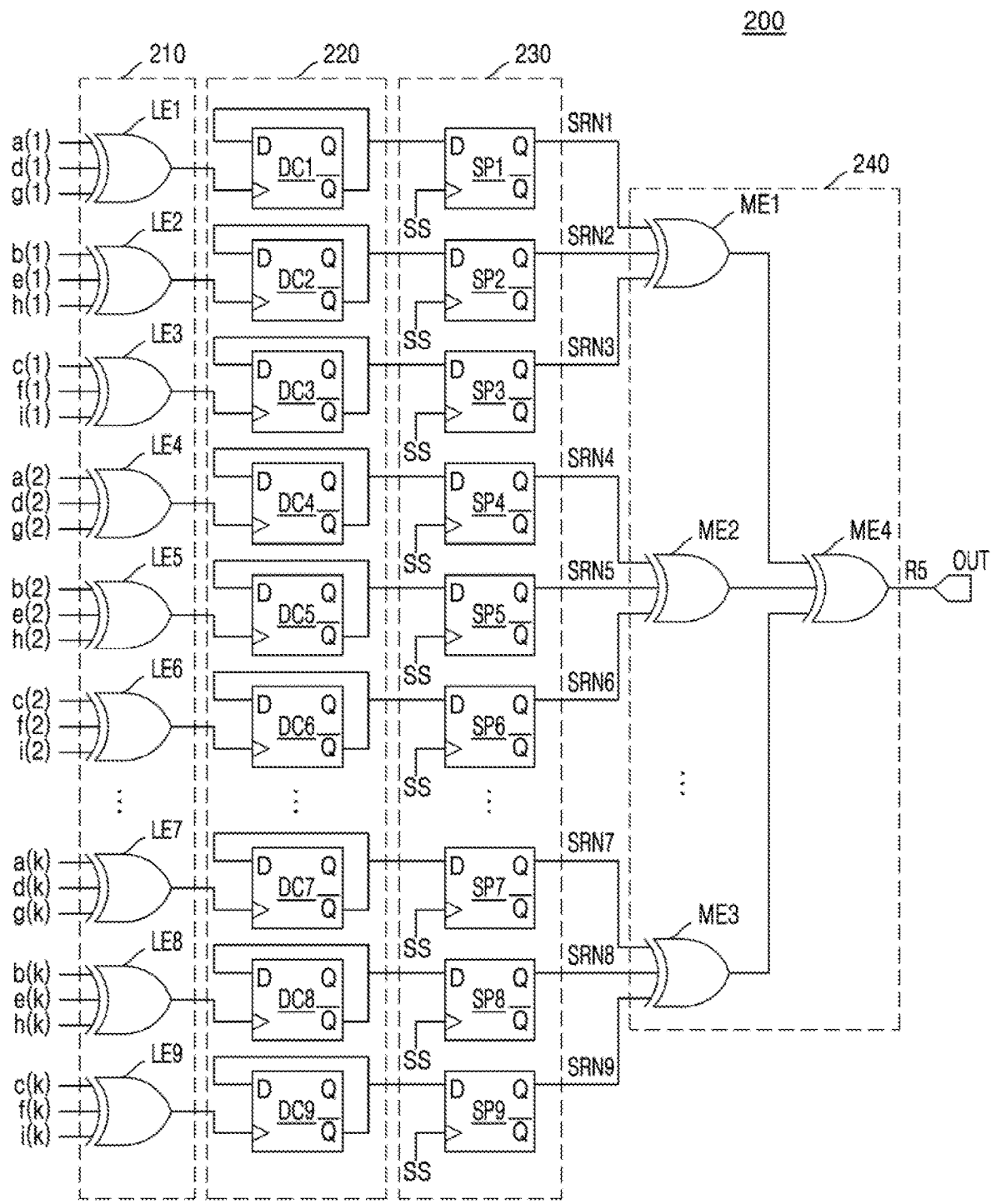
FIG. 4 is a circuit diagram illustrating a signal processing circuit according to an exemplary embodiment of the inventive concept.

FIG. 4 is a circuit diagram illustrating a signal processing circuit 200 according to an exemplary embodiment of the inventive concept.

Referring to FIGS. 3A to 3C and 4, the signal processing circuit 200 may include the logic circuit 210, the duty correcting circuit 220, the sampling circuit 230, and the merging circuit 240.

The logic circuit 210 may include first, second, third, fourth, fifth, sixth, seventh, eighth and ninth logic elements LE1, LE2, LE3, LE4, LE5, LE6, LE7, LE8 and LE9. Each of the first to ninth logic elements LE1 to LE9 may be connected to the plurality of ring oscillators through the plurality of sub-nodes. For example, the first logic element LE1 may be connected to the first sub-node SN11 of the first ring oscillator 111 (FIG. 3A) through the first a line a(1), may be connected to the fourth sub-node SN41 of the fourth ring oscillator 121 (FIG. 3B) through the first d line d(1), and may be connected to the seventh sub-node SN71 of the seventh ring oscillator 131 (FIG. 3C) through the first g line g(1). The first logic element LE1 may receive the plurality of random signals through the first a line a(1), the first d line d(1), and the first g lure g(1) and may generate a merging signal by merging the received random signals. In addition, the first logic element LE1 may output the generated merging signal to the first duty corrector DC1 of the duty correcting circuit 220.

The second logic element LE2 to the ninth logic element LE9 may receive the plurality of random signals from the plurality of sub-nodes of the plurality of ring oscillators by a method similar to that of the first logic element LE1, generate a merging signal by merging the received random signals, and may output the generated merging signal to the duty correcting circuit 220.

The duty correcting circuit 220 includes first, second, third, fourth, fifth, sixth, seventh, eighth and ninth duty correctors DC1, DC2, DC3, DC4, DC5, DC6, DC7, DC8 and DC9. Each of the first to ninth duty correctors DC1 to DC9 may correct a duty ratio of the received merging signal. According to an exemplary embodiment of the inventive concept, each of the first to ninth duty correctors DC1 to DC9 may be a flip-flop, to which a data input end D and an inverting output end Q' are connected, to receive the merging signal by a clock input unit. For example, the first duty corrector DC1 includes a clock input unit connected to the first logic element LE1 and may output a merging signal, which has a duty ratio corrected based on the merging signal received from the first logic element LE1, to a first signal sampler SP1 as a clock.

The second duty corrector DC2 to the ninth duty corrector DC9 include clock input units respectively connected to the second to ninth logic elements LE2 to LE9 in a manner similar to that of the first duty corrector DC1 and each of the clock input units may output a merging signal, which has a duty ratio corrected based on the merging signal received from a corresponding one of the second to ninth logic elements LE2 to LE9, to the sampling circuit 230 as a clock.

The sampling circuit 230 includes first, second, third, fourth, fifth, sixth, seventh, eighth and ninth signal samplers SP1, SP2, SP3, SP4, SP5, SP6, SP7, SP8 and SP9. Each of the first to ninth signal samplers SP1 to SP9 may generate first, second, third, fourth, fifth, sixth, seventh, eighth and ninth sub-random numbers SRN1, SRN2, SRN3, SRN4, SRN5, SRN6, SRN7, SRN8 and SRN9 in a digital region by sampling a merging signal which has its duty ratio corrected based on the sampling control signal SS. In an exemplary embodiment of the inventive concept, data input ends D of the first to ninth signal samplers SP1 to SP9 are respectively connected to the first to ninth duty correctors DC1 to DC9 and non-inverting output ends Q of the first to ninth signal samplers SP1 to SP9 may be connected to the merging circuit 240. For example, the first signal sampler SP1 receives the merging signal, which has its duty ratio corrected, from the first duty corrector DC1 and may generate the first sub-random number SRN1 by sampling the merging signal, which is duty ratio corrected, based on the sampling control signal SS received from a clock input end of the first signal sampler SP1.

The second signal sampler SP2 to the ninth signal sampler SP9 may generate the second to ninth sub-random numbers SRN2 to SRN9 by sampling the merging signal, which is duty ratio is corrected and which is received from the second to ninth duty correctors DC2 to DC9, respectively, based on the sampling control signal SS by a method similar to that of the first signal sampler SP1. The second signal sampler SP2 to the ninth signal sampler SP9 may output the generated second to ninth sub-random numbers SRN2 to SRN9 to the merging circuit 240.

The merging circuit 240 includes first, second, third and fourth merging elements ME1 to ME4, generates a random number RS by merging the received first to ninth sub-random numbers SRN1 to SRN9, and may output the generated random number RS. In FIG. 4, the merging circuit 240 configured by the first to fourth merging elements ME1 to ME4. However, the number of merging elements that configure the merging circuit 240 may vary in accordance with the number of sub-random numbers.

Figure 5:
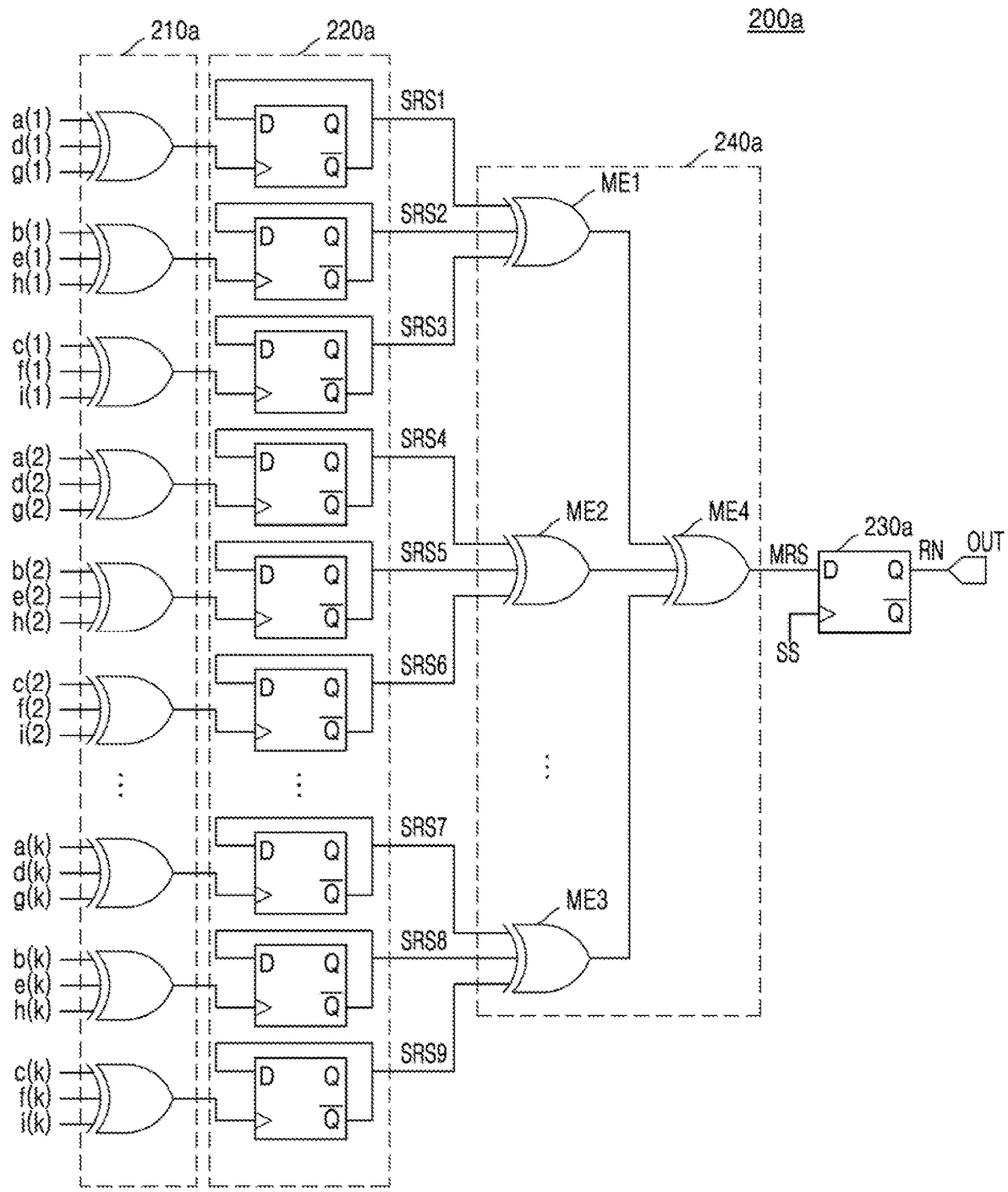
FIG. 5 is a circuit diagram illustrating a signal processing circuit according to an exemplary embodiment of the inventive concept.

FIG. 5 is a circuit diagram illustrating a signal processing circuit according to an exemplary embodiment of the inventive concept. Descriptions that are the same as those of FIG. 4 are omitted.

Referring to FIG. 5, a signal processing circuit 200a may include a logic circuit 210a, a duty ratio correcting circuit 220a, a merging circuit 240a, and a signal sampler 230a. Since the logic circuit 210a and the duty ratio correcting circuit 220a may be the same as or similar to the logic circuit 210 and the duty correcting circuit 220 of FIG. 4, the description of the logic circuit 210a and the duty ratio correcting circuit 220a is omitted.

The merging circuit 240a receives first, second, third, fourth, fifth, sixth, seventh, eighth and ninth combining signals SRS1 to SRS9 of which duty ratios are corrected and may generate a merging random signal MRS by merging the first to ninth combining signals SRS1 to SRS9. To accomplish this, the merging circuit 240a may include the first to fourth merging elements ME1 to ME4 like the merging circuit 240 of FIG. 4.

The signal sampler 230a may generate the random number RN in the digital region by sampling the merging random signal MRS in an analog region based on the sampling control signal SS. In an exemplary embodiment of the inventive concept, a data input end D of the signal sampler 230a is connected to the merging circuit 240a and a non-inverting output end Q of the signal sampler 230a may be connected to an output OUT.

Figure 6:
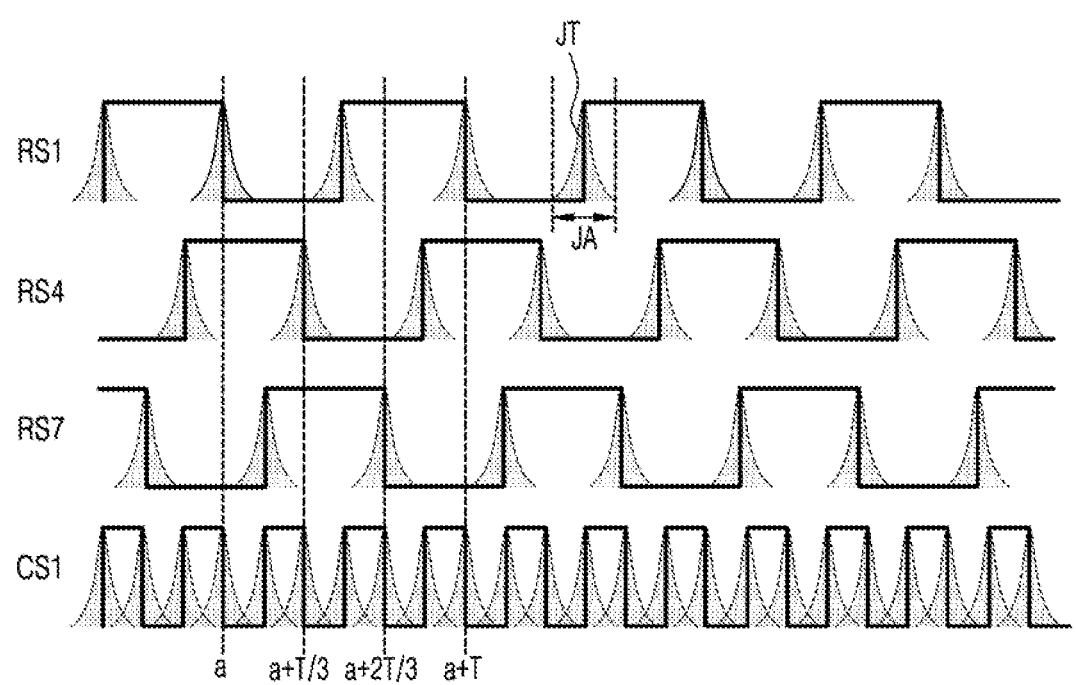
FIG. 6 is a timing diagram illustrating random signals according to an exemplary embodiment of the inventive concept.

FIG. 6 is a timing diagram illustrating random signals according to an exemplary embodiment of the inventive concept. In FIG. 6, the y axis illustrates a logic level and the x axis illustrates time.

Referring to FIGS. 2 and 6, the first random signal RS1, the fourth random signal RS4, and the seventh random signal RS7 that are input to the first logic element LE1 may repeatedly output logic high (for example, '1') and logic low (for example, '0') in a uniform period T. Due to a characteristic of the ring oscillator, transition points in time at which the first random signal RS1, the fourth random signal RS4, and the seventh random signal RS7 are transited from logic low to logic high or from logic high to logic low may randomly change. The transition points in time may produce jitter JT that changes in accordance with the Gaussian distribution. In the current specification, a temporal region in which the jitter JT is positioned is referred to as a jitter area JA. This is shown by the shading in FIG. 6.

According to an exemplary embodiment of the inventive concept, the plurality of random signals (for example, the first random signal RS1, the fourth random signal RS4, and the seventh random signal RS7) input to the one logic element (for example, the first logic element LE1) may have different phase differences.

For example, when the three random signals are input to the one logic element, the three random signals may have a phase difference of 120 degrees. In FIG. 6, the first random signal RS1 has a falling edge at a first point in time (a), the fourth random signal RS4 has a falling edge at a second point in time (a+T/3), and the seventh random signal RS7 may have a falling edge at a third point in time (a+2T/3).

In an exemplary embodiment of the inventive concept, since the first random signal RS1, the fourth random signal RS4, and the seventh random signal RS7 are generated by the ring oscillators each having the same number of inverters, the first random signal RS1, the fourth random signal RS4, and the seventh random signal RS7 may have the same period. Since the first random signal RS1, the fourth random signal RS4, and the seventh random signal RS7 are generated by the sub-nodes in the same position of the ring oscillator group, the first random signal RS1, the fourth random signal RS4, and the seventh random signal RS7 may have a phase difference of 120 degrees. In other words, the first random signal RS1, the fourth random signal RS4, and the seventh random signal RS7 may have a phase difference of ⅓ (T/3) the period.

In an example in which the jitter area JA is no less than ⅙ (T/6) the period, the jitter JT of the first combining signal CS1 for combining the first random signal RS1, the fourth random signal RS4, and the seventh random signal RS7 may cover an entirety of the period. In other words, the jitter JT of the first combining signal CS1 make exist for the entire period T.

$$\sigma_{need} = \frac{1}{freq_{RO}} * \frac{1}{2} * \frac{1}{n} \quad \text{[EQUATION 1]}$$

$$t_{need} = \frac{1}{2^2 * n^2 * \sigma_{cycle}^2 * freq_{RO}^3} \quad \text{[EQUATION 2]}$$

EQUATION 1 is for obtaining sigma (or standard deviation) $\sigma_{need}$ needed for sufficient randomness according to the inventive concept and EQUATION 2 is for obtaining $t_{need}$ needed for sufficient randomness according to the inventive concept. $freq_{RO}$ represents an operating frequency of a ring oscillator, $\sigma_{cycle}$ is sigma accumulated in a period, and n represents the number of random signals RS1, RS4, and RS7. According to EQUATION 1 and EQUATION 2, as the number n of random signals increases, the sigma needed $\sigma_{need}$ and the time needed $t_{need}$ may be respectively reduced $1/n$ time and $1/n^2$ time.

According to an exemplary embodiment of the inventive concept, the random number with high randomness is generated based on a signal (for example, the first combining signal CS1) of which the jitter JT covers the entirety of the period and accordingly, the randomness of the random number may increase and the random number with the high randomness may be quickly generated.

In FIG. 6, it is illustrated that the three random signals are combined. However, in another example, more or less than three random signals may be combined.

Figure 7A:
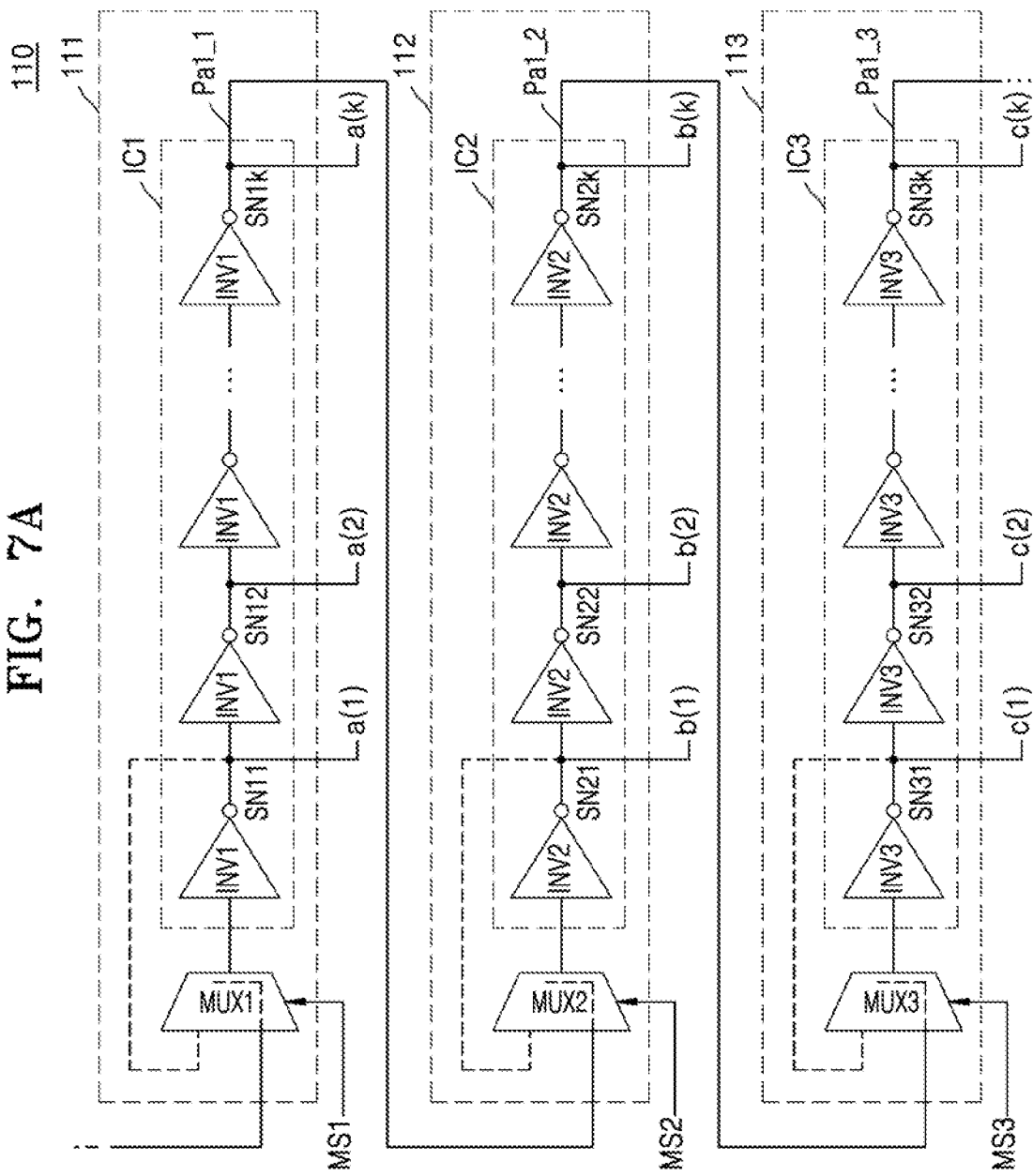
FIG. 7A is a circuit diagram illustrating a ring oscillator group according to an exemplary embodiment of the inventive concept.

FIG. 7A is a circuit diagram illustrating a ring oscillator group according to an exemplary embodiment of the inventive concept. For example, FIG. 7A illustrates an embodiment in which the ring oscillator group operates in the oscillation mode. Descriptions that are the same as those of FIG. 3A are omitted.

Referring to FIG. 7A, the first ring oscillator group 110 may include the first ring oscillator 111, the second ring oscillator 112, and the third ring oscillator 113. The first ring oscillator 111 to the third ring oscillator 113 may operate in the oscillation mode based on first to third mode selection signals MS1 to MS3.

The first multiplexer MUX1 may configure a first sub-path Pa1_1 including the plurality of first inverters INV1 by connecting the input end of the first inverter chain IC1 to another ring oscillator (for example, the ninth ring oscillator 133 of FIG. 2) based on the first mode selection signal. In addition, the second multiplexer MUX2 may configure a second sub-path Pa1_2 including the plurality of second inverters INV2 by connecting an input end of the second inverter chain IC2 to the first ring oscillator 111 based on the second mode selection signal MS2. The third multiplexer MUX3 may configure a third sub-path Pa1_3 including the plurality of third inverters INV3 by connecting an input end of the third inverter chain IC3 to the second ring oscillator 112 based on the third mode selection signal MS3.

The first sub path Pa1_1 to the third sub-path Pa1_3 may form a first path configured by the plurality of first to third inverters INV1 to INV3. The plurality of inverters continuously inverting amplify an input signal and accordingly, random signals may be generated by sub-nodes SN11 to SN3k.

Figure 7B:
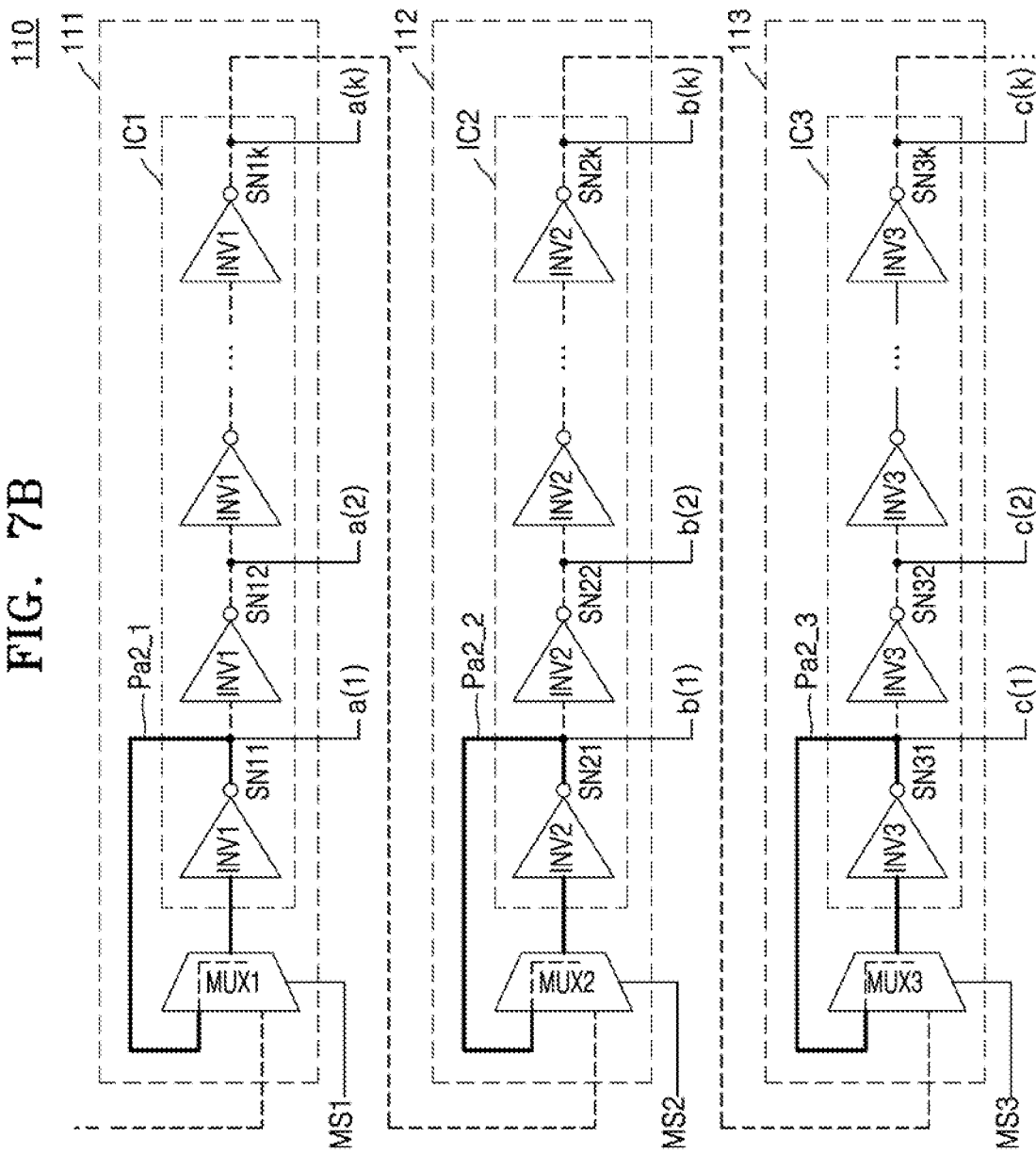
FIG. 7B is a circuit diagram illustrating a ring oscillator group according to an exemplary embodiment of the inventive concept.

FIG. 7B is a circuit diagram illustrating a ring oscillator group according to an exemplary embodiment of the inventive concept. For example, FIG. 7B illustrates an embodiment in which the ring oscillator group operates in the meta-stability mode. Descriptions that are the same as those of FIG. 3A are omitted.

Referring to FIG. 7B, the first ring oscillator group 110 may include the first ring oscillator 111, the second ring oscillator 112, and the third ring oscillator 113. The first ring oscillator 111 to the third ring oscillator 113 may operate in the meta-stability mode based on the first to third mode selection signals MS1 to MS3.

The first multiplexer MUM may connect the input end of the first inverter chain IC1 to an output end (for example, the first node SN11) of the first inverter INV1 positioned first in the first inverter chain IC1 based on the first mode selection signal MS1 and may configure a fourth sub-path Pa2_1 including the first inverter INV1. In addition, the second multiplexer MUX2 may connect the input end of the second inverter chain IC2 to an output end (for example, the second node SN21) of the second inverter INV2 positioned first in the second inverter chain IC2 based on the second mode selection signal MS2 and may configure a fifth sub-path Pa2_2 including the second inverter INV2. The third multiplexer MUX3 may connect the input end of the third inverter chain IC3 to an output end (for example, the third node SN31) of the third inverter INV3 positioned first in the third inverter chain IC3 based on the third mode selection signal MS3 and may configure a sixth sub-path Pa2_3 including the third inverter INV3.

The fourth sub-path Pa2_1 to the sixth sub-path Pa2_3 may form loops each including one inverter. Since the one inverter is repeatedly inverting amplified, a meta-stable signal may be generated. As described later with reference to FIGS. 8 and 9, a signal generated in the meta-stability mode may be input as an initial value in the oscillation mode. Therefore, the first to third ring oscillators 111 to 113 may generate stable random signals by repeatedly inverting amplifying the meta-stable signal in the oscillation mode.

The second ring oscillator group 120 (FIG. 3B) and the third ring oscillator group 120 (FIG. 3C) may operate by a method that is the same as or similar to that of the first ring oscillator group 110.

Figure 8:
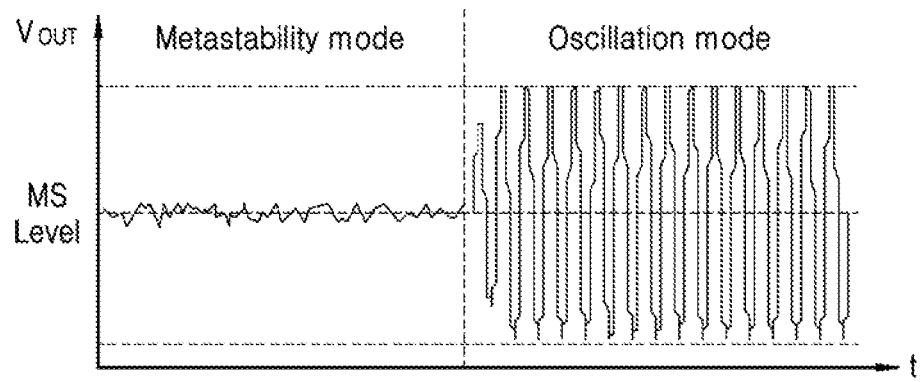
FIGS. 8 and 9 are graphs illustrating output waveforms generated by a ring oscillator.
Figure 9:
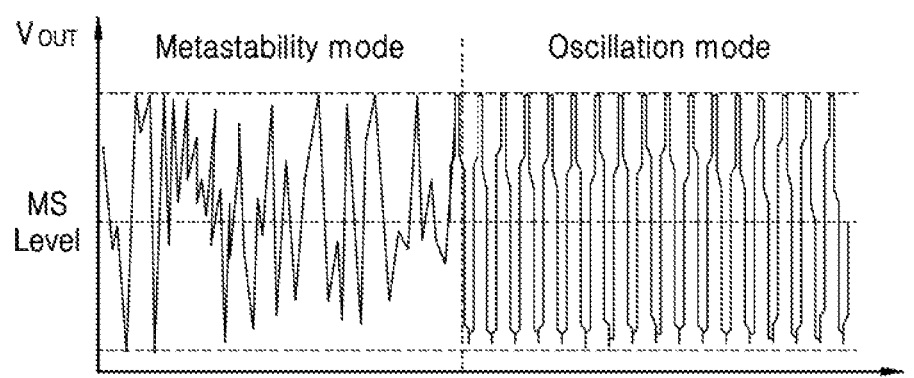

FIGS. 8 and 9 are graphs illustrating output waveforms generated by a ring oscillator.

Referring to FIGS. 8 and 9, a random signal output from a sub-node of a ring oscillator is illustrated. In the meta-stability mode, a meta-stable signal is output by the sub-node of the ring oscillator due to thermal noise. In the oscillation mode, an oscillating signal generated by inverting amplifying the meta-stable signal is output from the sub-node.

In the meta-stability mode, based on an intermediate level MS Level, a meta-stable signal that may not be clearly determined to be logic high or logic low is generated as the random signal. The meta-stable signal is input as the initial value in the oscillation mode and is inverting amplified by the ring oscillator and accordingly, an oscillating signal that may be determined to be logic low or logic high may be generated.

According to an exemplary embodiment of the inventive concept, since a signal level of the meta-stable signal in the meta-stable mode is unclear, the randomness of the initial value in the oscillation mode may increase and the randomness of the random signal may increase.

Figure 10:
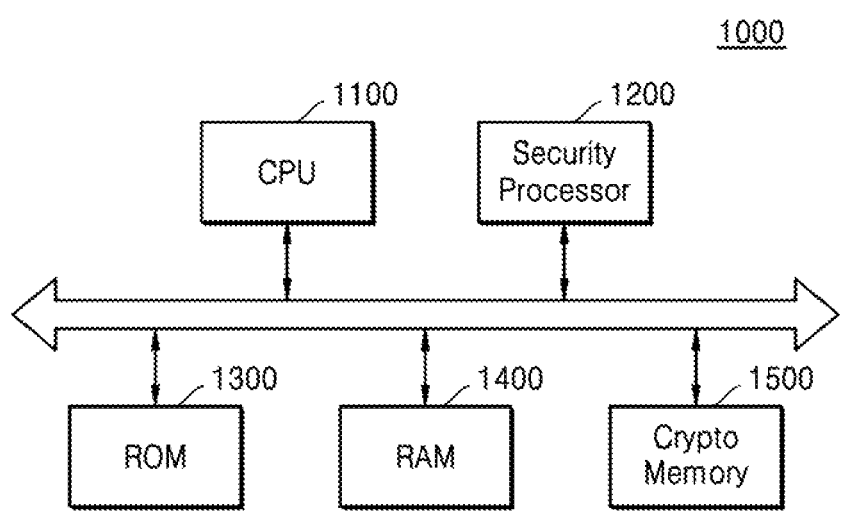
FIG. 10 is a block diagram illustrating a security system according to an exemplary embodiment of the inventive concept.

FIG. 10 is a block diagram illustrating a security system according to an exemplary embodiment of the inventive concept.

Referring to FIG. 10, a security system 1000 includes a central processing unit (CPU) 1100, a security processor 1200, a read only memory (ROM) 1300, a random access memory (RAM) 1400, and a crypto memory 1500. The security system 1000 may correspond to various kinds of systems using security and may be, for example, a laptop computer, a mobile telephone, a smart phone, a tablet PC, a PDA, or a smart card.

The CPU 1100 may output various control signals for controlling an operation of the security system 1000. In another exemplary embodiment of the inventive concept, an application processor (AP) may function as the CPU 1100.

The security processor 1200 can implement an operation processing speed related to quick security in addition to the CPU 1100. The security processor 1200 may perform an operation using private information and may be referred to as a security operator. For example, the security processor 1200 may perform an encryption or decryption operation by using a private key in a public key infrastructure (PRI).

The security processor 1200 may perform various kinds of operations in relation to the encryption or decryption operation. For example, an entire operation for encrypting or decrypting data or partial operations among a plurality of operations required for encryption or decryption may be performed by the security processor 1200. The security processor 1200 may include a random number generator in accordance with the embodiments of the inventive concept described above with reference to FIGS. 1 to 9 to perform the encryption or decryption operation. In other words, the security processor 1200 may perform the encryption or decryption operation by using the random number generated by combining the random signals generated by the plurality of sub-nodes included in the plurality of ring oscillators and accordingly, the security of the security processor 1200 may increase.

The ROM 1300 and the RAM 1400 may store data used to drive the security system 1000. The crypto memory 1500 stores data used to drive the security processor 1200. In other words, the crypto memory 1500 records data to be encrypted or decrypted and may store encrypted or decrypted recovery data.

Exemplary embodiments of the inventive concept provide a random number generator for increasing a range covered by jitter by combining sub-output signals generated by a plurality of sub-nodes, and generating random numbers based on the combined signals.

While the inventive concept has been particularly shown and described with reference to exemplary embodiments thereof, it will be understood that various changes in form and details may be made thereto without departing from the spirit and scope of the inventive concept as set forth in the following claims.

What is claimed is:
1. A random number generator, comprising:
first ring oscillator including a first inverter chain, the first inverter chain including a plurality of serially connected first inverters, the first ring oscillator configured to output first random signals generated at first sub-nodes, each of the first sub-nodes connecting two neighboring first inverters among the plurality of first inverters;
second ring oscillator including a second inverter chain, the second inverter chain including a plurality of serially connected second inverters, the second ring oscillator configured to output second random signals generated at second sub-nodes, each of the second sub-nodes connecting two neighboring second inverters among the plurality of second inverters;

third ring oscillator including a third inverter chain, the third inverter chain including a plurality of serially connected third inverters, the third ring oscillator configured to output third random signals generated at third sub-nodes, each of the third sub-nodes connecting two neighboring third inverters among the plurality of third inverters; and signal processing circuit comprising a plurality of logic elements, wherein the signal processing circuit is configured to generate a random number by performing an exclusive OR (XOR) operation on random signals received from the same relative sub-nodal position with respect to the number of inverters in front of the sub-node in each of the first to third ring oscillators, wherein a jitter area of a first combining signal generated by combining one of the first random signals, one of the second random signals and one of the third random signals covers an entire period of the first combining signal and the entire period of the first combining signal includes a period of the one of the first random signals, a period of the one of the second random signals and a period of the one of the third random signals.

2. The random number generator of claim 1, wherein the signal processing circuit generates the random number by combining the first random signals, the second random signals, and the third random signals.

3. The random number generator of claim 1, wherein a phase difference among a first random signal, a second random signal, and a third random signal input to a first logic element of the plurality of logic elements is 120 degrees.

4. The random number generator of claim 1, wherein each of the first random signals, the second random signals, and the third random signals includes a jitter area, wherein in the jitter area of each of the first random signals, the second random signals, and the third random signals a logic level is transited at random times, and wherein the jitter area of each of the first random signals, the second random signals, and the third random signals is not less than ⅙ of a period.

5. The random number generator of claim 1, wherein the number of first inverters included in the first inverter chain is the same as the number of second inverters included in the second inverter chain, and wherein the number of first inverters included in the first inverter chain is the same as the number of third inverters included in the third inverter chain.

6. The random number generator of claim 1, wherein the signal processing circuit further comprises:
a duty corrector for correcting a duty ratio between logic high and logic low of the first combining signal; and
a signal sampler for generating the random number by sampling the first combining signal which has a corrected duty ratio.

7. The random number generator of claim 6, wherein the duty corrector comprises a first flip-flop including a data input and an inverting output connected to each other, the first flip-flop configured to receive the first combining signal at a dock input and to output the first combining signal having the corrected duty ratio to the inverting output.

8. The random number generator of claim 7, wherein the signal sampler comprises a second flip-flop for receiving a sampling control signal at a clock input, receiving the first combining signal having the corrected duty ratio at a data input, and outputting the random number at a non-inverting output.

9. The random number generator of claim 1, further comprising a fourth ring oscillator including a fourth inverter chain, the fourth inverter chain including a plurality of serially connected fourth inverters, wherein the first ring oscillator further comprises a multiplexer for setting the first ring oscillator to be in a meta-stability mode or an oscillation mode, wherein the multiplexer forms a first path in which a first input node in which a signal is input to the first inverter chain is connected to a sub-node in which a signal is output from a first inverter positioned first among the plurality of first inverters in the meta-stability mode, and wherein a second path in which the first input node is connected to a first output node in which a signal is output from a fourth inverter positioned last among the plurality of fourth inverters is formed in the oscillation mode.

10. The random number generator of claim 9, wherein a first input of the multiplexer is connected to the first output node, a second input of the multiplexer is connected to the sub-node, and an output of the multiplexer is connected to the first input node, and wherein the multiplexer connects one of the first output node and the sub-node to the first or second input in response to a mode control signal.

11. A random number generator, comprising:
a first ring oscillator group including a plurality of first ring oscillators configured to output a plurality of first random signals generated at a plurality of first sub-nodes between two neighboring first inverters among a plurality of first inverters included in each of the plurality of first ring oscillators;
a second ring oscillator group including a plurality of second ring oscillators configured to output a plurality of second random signals generated at a plurality of second sub-nodes between two neighboring second inverters among a plurality of second inverters included in each of the plurality of second ring oscillators;
a third ring oscillator group including a plurality of third ring oscillators configured to output a plurality of third random signals generated at a plurality of third sub-nodes between two neighboring third inverters among a plurality of third inverters included in each of the plurality of third ring oscillators; and
a signal processing circuit for generating a random number based on a combination of the plurality of first random signals, the plurality of second random signals, and the plurality of third random signals, wherein the signal processing circuit comprises a plurality of logic elements, wherein the signal processing circuit is configured to generate the random number, wherein the signal processing circuit is configured to perform an exclusive OR (XOR) operation on a random signal from one first sub-node located at a first position of the first ring oscillator among the first sub-nodes, a random signal from one second sub-node located at the first position of the second ring oscillator among the second sub-nodes, and a random signal from one third sub-node located at the first position of the third ring oscillator among the third sub-nodes connected to a first logic element included in the plurality of logic elements, wherein the signal processing circuit is configured to perform an XOR operation on a random signal from one first sub-node located at a second position of the first ring oscillator among the first sub-nodes, a random signal from one second sub-node located at the second position of the second ring oscillator among the second sub-nodes, and a random signal from one third sub-node located at the second position of the third ring oscillator among the third sub-nodes connected to a second logic element included in the plurality of logic elements, wherein a jitter area of a combining signal generated by combining the random signal from the one first sub-node, the random signal from the one second sub-node, and the random signal from the one third sub-node covers an entire period of the combining signal, and wherein the entire period of the combining signal includes a period of the random signal from the one first sub-node, a period of the random signal from the one second sub-node and a period of the random signal from the one third sub-node.

12. The random number generator of claim 11, wherein the signal processing circuit comprises:
a logic circuit for generating a plurality of output signals by performing a logic operation on the plurality of first random signals, the plurality of second random signals, and the plurality of third random signals;
a duty correcting circuit for correcting a duty ratio between logic high and logic low of each of the plurality of output signals;
a sampling circuit for generating a plurality of sub-random numbers by sampling the plurality of output signals having corrected duty ratios; and
a merging circuit for generating the random number based on the plurality of sub-random numbers.

13. The random number generator of claim 12, wherein the logic circuit comprises a plurality of XOR gates each for generating one of the output signals by receiving and performing the exclusive OR operation on the first random signal, the second random signal, and the third random signal.

14. The random number generator of claim 13, wherein the duty correcting circuit comprises a plurality of first flip-flops, each including a data input and an inverting output connected to each other, the plurality of first flip-flops each configured to receive one of the plurality of output signals at a clock input and to output one of the plurality of output signals of having the corrected duty ratios to the inverting output.

15. The random number generator of claim 13, wherein the sampling circuit comprises a plurality of second flip-flops, each configured to receive a sampling control signal at a clock input, receive one of the plurality of output signals having the corrected duty ratio at a data input, and output one of the plurality of sub-random numbers to a non-inverting output.

16. The random number generator of claim 11, wherein the merging circuit comprises at least one logic element for receiving the plurality of sub-random numbers and generating the random number by performing a logic operation on the plurality of sub-random numbers.

17. A random number generator, comprising:
a first inverter chain including a plurality of serially connected first inverters and a plurality of first sub-nodes connected to an output terminal of each of the first inverters;
a second inverter chain including a plurality of serially connected second inverters and a plurality of second sub-nodes connected to an output terminal of each of the second inverters;
a third inverter chain including a plurality of serially connected third inverters and a plurality of third sub-nodes connected to an output terminal of each of the third inverters; and
a logic element configured to receive a random signal from one sub-node of the plurality of first sub-nodes, a random signal from one sub-node of the plurality of second sub-nodes, and a random signal from one sub-node of the plurality of third sub-nodes,
wherein the one sub-node of the plurality of first sub-nodes, the one sub-node of the plurality of second sub-nodes and the one sub-node of the plurality of third sub-nodes have identical sub-nodal positions with respect to the number of inverters in front of the sub-node within each inverter chain,
wherein jitter area of combining signal generated by combining the random signal from the one first sub-node, the random signal from the one second sub-node, and the random signal from the one third sub-node covers an entire period of the combining signal, and
wherein the entire period of the combining signal includes a period of the random signal from the one first sub-node, a period of the random signal from the one second sub-node and a period of the random signal from the one third sub-node.

18. The random number generator of claim 17, further comprising
a fourth inverter chain including a plurality of serially connected fourth inverters; and
a multiplexer connected to the first inverter chain to put the first inverter chain in a meta-stability mode or an oscillation mode,
wherein the multiplexer forms a first path in which a first input node in which a signal is input to the first inverter chain is connected to a sub-node of plurality of first sub-nodes that receives a signal output from a first inverter positioned first among the plurality of first inverters in the meta-stability mode, and
wherein a second path in which the first input node is connected to a first output node in which a signal is output from a fourth inverter positioned last among the plurality of fourth inverters is formed in the oscillation mode.

\* \* \* \* \*